United States Patent [19]

Krueger et al.

[11] Patent Number: 4,606,871
[45] Date of Patent: Aug. 19, 1986

[54] METHOD OF MAKING A FILM FROM PYROELECTRIC AND ISOTROPIC PIEZOELECTRIC POLYMER BLENDS

[75] Inventors: Dennis L. Krueger, Hudson, Wis.; Neil W. Loeding, Mounds View; Claudia I. Poser, St. Paul, both of Minn.

[73] Assignee: Minnesota Mining and Manufacturing Company, St. Paul, Minn.

[21] Appl. No.: 605,917

[22] Filed: May 1, 1984

Related U.S. Application Data

[60] Division of Ser. No. 413,764, Sep. 1, 1982, abandoned, which is a division of Ser. No. 273,901, Jun. 19, 1981, abandoned, which is a continuation-in-part of Ser. No. 171,279, Jul. 23, 1980, abandoned.

[51] Int. Cl.$^4$ .............................................. B29C 35/10
[52] U.S. Cl. ..................................... 264/22; 264/216; 427/100; 525/199
[58] Field of Search ................... 264/22, 216; 427/12, 427/100; 525/199; 428/421, 476.6

[56] References Cited

U.S. PATENT DOCUMENTS

| | | | |
|---|---|---|---|
| 3,324,069 | 6/1967 | Koblitz et al. | 524/360 |
| 3,607,754 | 9/1971 | Asahina et al. | 307/400 |
| 3,794,986 | 2/1974 | Murayama | 307/400 |
| 3,833,503 | 9/1974 | Murayama et al. | 307/400 |
| 3,895,029 | 7/1975 | Ward | 524/365 |
| 3,941,860 | 3/1976 | Couchoud et al. | 525/199 |
| 4,067,056 | 1/1978 | Taylor et al. | 361/233 |
| 4,079,437 | 3/1978 | Sheffield | 361/233 |
| 4,089,034 | 5/1978 | Taylor et al. | 361/233 |

*Primary Examiner*—Donald Czaja
*Assistant Examiner*—Mary Lynn Fertig
*Attorney, Agent, or Firm*—Donald M. Sell; James A. Smith; Gerald F. Chernivec

[57] ABSTRACT

A pyroelectric and isotropic piezoelectric polymeric film, the film being formed from a blend of polyvinylidene fluoride and at least one polymer miscible therewith at a temperature above the melting point of the polyvinylidene fluoride, and a process for preparing the film comprising forming the film, heating it to a temperature sufficient to render the film substantially amorphous, cooling at a rate and to a temperature sufficient to prevent crystallization, and polarizing the film to render same pyroelectric and isotropically piezoelectric.

6 Claims, No Drawings

METHOD OF MAKING A FILM FROM PYROELECTRIC AND ISOTROPIC PIEZOELECTRIC POLYMER BLENDS

This is a division of application Ser. No. 413,764, filed Sept. 1, 1982, which is a divisional application of Ser. No. 273,901, filed June 19, 1981, which is a continuation-in-part application of Ser. No. 171,279, filed July 23, 1980, all now abandoned.

DESCRIPTION

1. Technical Field

The invention relates to a polymeric film or coating which is capable of displaying pyroelectric and isotropic piezoelectric properties, and more particularly relates to a blend of polymers which allows the formation of a pyroelectric and isotropic piezoelectric film without the necessity of mechanical orientation, i.e., the mechanical stretching or elongation, of the film.

2. Background Art

Certain polymeric films have been found to be capable of exhibiting pyroelectric properties, i.e., capable of reacting, in terms of electrical charge polarization, to a change in temperature of the material, and piezoelectric properties, i.e., capable of reacting in the same manner to changes in strain of said film. These films are typically poled, which essentially involves the application of an intense electric field gradient thereto. In essence, the film after poling retains an electrical polarization and becomes substantially stable relative thereto unless changes in strain (piezoelectric) or temperature (pyroelectric) occur. One such film which has found exceptional use in this area is polyvinylidene fluoride.

Polyvinylidene fluoride, when manufactured in film form, such as by an extruder, etc., has a crystalline structure which is in essence of the alpha type. It has been found, however, that the alpha crystalline film, when poled, does not provide a film displaying sufficient pyroelectric or piezoelectric properties for practical utility. Therefore, the crystallinity of the film is typically changed to the beta type, which is susceptible to successful poling to render the film sufficiently pyroelectric and piezoelectric. Typically, this change in the crystalline structure from alpha to beta is undertaken by biaxial or uniaxial orientation, i.e., stretching the film in a heated state and retaining same in the stretched state while the film is allowed to cool. The resultant film exhibits the beta crystallinity which can, as aforementioned, be successfully poled to render same pyroelectric and piezoelectric.

We have now found that by using a blend of polymers, processing of same to a film or a coating on an article can be undertaken without the necessity of mechanical orientation of the film to the beta crystallinity, and yet a film or coating displaying pyroelectric and isotropic piezoelectric characteristics can be obtained.

DISCLOSURE OF INVENTION

In accordance with the invention there is provided a method for producing a polymeric film or coating capable of displaying pyroelectric and isotropic piezoelectric properties, the process comprising either solvent casting or melt blending a polymer blend into film form or coating onto an article, heating the film to a temperature above the melting point of the polyvinylidene fluoride for a sufficient time to render the film substantially amorphous, cooling the film at a rate and to a temperature sufficient to prevent the crystallization of the film, followed by polarization thereof to render the film pyroelectric and isotropically piezoelectric, and the film or article which results therefrom. The resultant film is not mechanically oriented and comprises a blend of polyvinylidene fluoride and at least one polymer which is miscible with the polyvinylidene fluoride at a temperature above the melting point thereof.

BEST MODE FOR CARRYING OUT THE INVENTION

The polyvinylidene fluoride polymer utilized in this invention is of any of those types which are commercially available. Exemplary materials include Kureha 1100 (available from Kureha Chemical), Solvay 1012 (available from Soltex Polymer Corp.), and Kynar 301-F (available from Pennwalt Corp.).

The other polymers suitable for use in the polymer blend include those which are miscible with polyvinylidene fluoride, at a temperature above the melting point of the polyvinylidene fluoride. Miscibility herein means that the polymer blend exhibits a single glass transition temperature. Exemplary polymers include acrylates, e.g., polymethylacrylate; methacrylates, e.g., polymethylmethacrylate and polyethylmethacrylate; and polyvinylacetate.

In order to optimize the pyroelectric and piezoelectric characteristics of the polymer film, the blend should contain at least about 50 percent polyvinylidene fluoride, the balance being the polymers exemplified above.

In the preparation of the polymer film comprising the aforementioned blend, the polymers can be intimately mixed (in batch mixers such as the Banbury-type and roll mill type or in continuous mixers such as single and twin screw extruders) at an elevated temperature, typically called melt blending, until a uniform homogeneous mixture is obtained, following which a film can be prepared from the homogeneous mixture utilizing conventional equipment, such as an extruder, etc.

Alternatively, the polymers can be dissolved in a suitable solvent for application by conventional solvent casting techniques, e.g., spin casting, dip coating, knife coating, roll bar coating, spraying, etc. An exemplary solvent is dimethyl formamide. Solvent casting can be undertaken on articles such as metallic foil, integrated circuits, etc. This technique has special utility for coating an article such as where requirements such as small size or the necessity of direct electrical communication between article elements precludes the use of prepoled and subsequently adhered film.

In light of the foregoing, the term "film" should be construed to include both the self-supporting web and a coating applied to an article.

The resultant film is then heated to remove the solvent therefrom, as in the case of solvent casting, and then heated to a temperature above the melting point of the polyvinylidene fluoride for sufficient time to render the film substantially amorphous. Following this heating step, the film is cooled at a rate and to a temperature sufficient to prevent the crystallization of the film.

If a metallic substrate is used, same can typically be selected from thin metal or alloy foils, examples of which include aluminum, copper, chromium, various steels, etc. In the case of solvent casting, thin metal films are preferred in order to provide rapid heat transfer so that the solvent from the coating solution will readily evaporate. Furthermore, in the subsequent heating step, after either solvent casting or melt blending, the thin metal film acts as a heat transfer medium to provide rapid cooling and thus prevent crystallization of the polymers in the film. Other substrates useful for receiving the polymer film include glass, ceramic (especially woven or non-woven ceramic fabrics), silicon, etc.

Additionally, the polymer blend can be solvent cast onto selected areas of devices, processed as above, and poled in situ to utilize the piezoelectric and pyroelectric properties of the polymer blend.

A film may or may not be removed from a metal web and poled by conventional static methods, or the film can be continuously poled as described in U.S. Pat. Nos. 4,067,056; 4,079,437; or 4,089,034. During the poling operation, the substantially amorphous polymeric polyvinylidene fluoride is converted to the beta crystalline form under the influence of the electric field. In this fashion, the resultant polarized film is substantially in the beta crystalline form, without necessity for mechanical orientation of the film, because the maintaining of the blend in the substantially amorphous form prior to polarization avoids the formation of the alpha crystalline form of the polyvinylidene fluoride.

Furthermore, by the use of our process, the resultant polarized film exhibits isotropic piezoelectric properties in the plane of the film. By isotropic piezoelectric properties we mean that the piezoelectric constant $d_{31}$ is equal to $d_{32}$. In defining the piezoelectric constant, designations 1 and 2 correspond to any orthogonal directions in the plane of the film and designation 3 corresponds to a direction perpendicular to the plane of the film.

Alternatively, when mechanical orientation is undertaken to achieve the beta-crystalline form, such equality cannot typically be obtained in commercial practice.

The invention will now be more specifically described by the use of the following non-limiting examples, wherein all parts are by weight unless otherwise specified.

EXAMPLE 1

Mixtures of polyvinylidene fluoride (Kynar ® 301-F from Pennwalt) and polymethylmethacrylate (Rohm and Haas Acryloid ® A-11) were dissolved in dimethylformamide (DMF) by stirring and heating to 120°–160° C. over a three hour period. Films were cast from a portion of the resulting solutions onto 1.0 mil (0.025 mm) thick aluminum foil using a six inch (15.24 cm) draw bar coater. The coated foil was immediately placed on a 150° C. hot plate for 15 minutes to drive off most of the DMF, and then the coated foil was placed in a 150°–200° C. oven for one-half hour. Just prior to poling, the coated foil was heated to 220°–240° C. for 15 minutes and then rapidly cooled to room temperature. The resulting films, which measured about 1.0 mil (0.025 mm) thick, were poled as described in U.S. Pat. Nos. 4,067,056; 4,079,437; or 4,089,034.

| Sample | $PVF_2$ (1) | PMMA (2) | DMF (3) | KV (4) | Time (5) (sec.) | p (6) (volts/- mil °C.) |
|---|---|---|---|---|---|---|
| A | 8 | 2 | 40(a) | 6 | 8 | 6.3 |
| B | 8 | 3.4 | 45.6(b) | 6 | 8 | 4.95 |
| C | 7 | 4.7 | 46.8 | 6 | 33 | 0.81 |

(a)Ten grams of DMF were added to the solution just prior to casting
(b)Five grams of DMF were added to the solution just prior to casting
NOTE: The additions (a) and (b) provided both solutions with about the same viscosity.
(1) $PVF_2$ - polyvinylidene fluoride resin, grams
(2) PMMA - polymethylmethacrylate resin, grams
(3) DMF - dimethylformamide, grams
(4) KV - poling voltage, kilovolts
(5) time - residence time in field during poling
(6) p - calculated pyroelectric response for blend

EXAMPLE 2

Mixtures of polyvinylidene fluoride (SOLEF ® 1012 from Solvay) and polymethylmethacrylate (Rohm and Haas Acryloid ® A-11) were dissolved in dimethylformamide (DMF) by stirring and heating to 120°–160° C. over a three hour period. Films were cast from a portion of the resulting solutions onto 0.6 mil thick aluminum foil using a six inch (15.24 cm) draw bar coater. The coated foil was immediately placed on a 130° C. hot plate for 10 minutes to drive off most of the DMF, and then the coated foil was placed in a press for 10 minutes, the press platens having been heated to 220° C. A gap of at least one centimeter was maintained between the platens. Immediately after heating and just prior to poling, the films were quenched in ice water. The resulting films, whose thickness varied from 0.8 to 1.1 mil thick, were poled as described in U.S. Pat. Nos. 4,067,056; 4,079,437; or 4,089,034.

| Sample | $PVF_2$ (1) | PMMA (2) | DMF (3) | KV (4) | Time (5) (sec.) | p (6) (volts/- mil °C. |
|---|---|---|---|---|---|---|
| D | 6.5 | 3.5 | 40 | 6 | 8 | 3.1 |
| E | 7.5 | 2.5 | 40 | 6 | 8 | 3.8 |
| F | 9.0 | 1.0 | 40 | 6 | 8 | 3.3 |

(1) $PVF_2$ - polyvinylidene fluoride resin, grams
(2) PMMA - polymethylmethacrylate resin, grams
(3) DMF - dimethylformamide, grams
(4) KV - poling voltage, kilovolts
(5) time - residence time in field during poling
(6) p - calculated pyroelectric response for blend

EXAMPLE 3

Mixtures of polyvinylidene fluoride (SOLEF ® 1012 from Solvay) and polyvinyl acetate (CAT No. 346 from Scientific Polymer Products) were dissolved in dimethylformamide (DMF) by stirring and heating to 120°–160° C. over a three hour period. Films were cast from a portion of the resulting solution onto 0.6 mil thick aluminum foil using a six inch (15.24 cm) draw bar coater. The coated foil was immediately placed on a 130° C. hot plate for 10 minutes to drive off most of the DMF, and then the coated foil was heated to 220° C. for 10 minutes and then rapidly cooled by quenching in ice water. The resulting films, whose thickness varied from 1.0 to 1.2 mils, were poled as described in U.S. Pat. Nos. 4,067,056; 4,079,437; or 4,089,034.

| Sample | $PVF_2$ (1) | PVAc (2) | DMF (3) | KV (4) | Time (5) (sec.) | p (6) (volts/- mil °C.) |
|---|---|---|---|---|---|---|
| A | 6 | 4 | 40 | 6 | 8 | 3.7 |
| B | 7 | 3 | 40 | 6 | 8 | 4.5 |

-continued

| Sample | PVF$_2$ (1) | PVAc (2) | DMF (3) | KV (4) | Time (5) (sec.) | p (6) (volts/- mil °C.) |
| --- | --- | --- | --- | --- | --- | --- |
| C | 8 | 2 | 40 | 6 | 8 | 5.5 |

(1) PVF$_2$ - polyvinylidene fluoride resin, grams
(2) PVAc - polyvinyl acetate resin, grams
(3) DMF - dimethylformamide, grams
(4) KV - poling voltage, kilovolts
(5) time - residence time in field during poling
(6) p - calculated pyroelectric response for blend

EXAMPLE 4

Films were prepared as per Example 3 using polyethylmethacrylate (Elvacite ® 2042 from DuPont) instead of polyvinyl acetate. Results of this film blend were:

| Sample | PVF$_2$ (1) | PEMA (2) | DMF (3) | KV (4) | Time (5) (sec.) | p (6) (volts/- mil °C.) |
| --- | --- | --- | --- | --- | --- | --- |
| A | 6 | 4 | 40 | 6 | 8 | 5.1 |
| B | 7 | 3 | 40 | 6 | 8 | 4.8 |
| C | 8 | 2 | 40 | 6 | 8 | 4.0 |

(1) PVF$_2$ - polyvinylidene fluoride resin, grams
(2) PEMA - polyethyl methacrylate resin, grams
(3) DMF - dimethylformamide, grams
(4) KV - poling voltage, kilovolts
(5) time - residence time in field during poling
(6) p - calculated pyroelectric response for blend

EXAMPLE 5

Polyvinylidene fluoride (240 grams of Kureha 1100), polymethylmethacrylate (110 grams of Rohm & Haas Acryloid ® A-11) and 1360 grams of dimethylformamide were charged into a container. The contents were stirred and maintained at a temperature of 200° F. (93° C.) for 20 hours. The resulting solution, when cooled to room temperature, had an acceptable viscosity for knife coating.

The viscous solution was knife coated with a 9 inch knife coater onto one ounce copper foil and the coated film was dried at 275° F. (135° C.) for 1.5 to 3.0 minutes.

The film was subsequently heated to 400° F. (204° C.) for 1.5 to 3.0 minutes and quenched to 95° F. (35° C.) within 8 to 15 seconds. The film was poled as described in U.S. Pat. Nos. 4,067,056; 4,079,437; or 4,089,034 and the resulting pyroelectric response was 2.3 to 4.0 V/mil °C.

EXAMPLE 6

A solution of polyvinylidene fluoride (Solef ® 1012, 70 percent by weight) and polymethyl methacrylate (Rohm & Hass Acryloid ® A11, 30 percent by weight) in dimethyl formamide was prepared at a solids content of 20 percent by weight. This solution was coated onto 0.6 mil aluminum foil using a 6 inch knife coater, dried at 270° F. for 15 minutes, heated to 425° F. for 10 minutes, and subsequently cooled rapidly. The resulting film, 0.9 mil thick, was poled as described in U.S. Pat. Nos. 4,067,056; 4,079,437; or 4,089,034. The poled film exhibited a pyroelectric response of 3.9 V/mil-°C. The piezoelectric constants, d$_{31}$ and d$_{32}$, were found to be equal at a value of d$_{31}$=d$_{32}$=3$_p$C/N. In defining the piezoelectric constants the convention of calling the knife coater direction 1, the transverse direction 2, and the direction perpendicular to the plane of the film 3 was employed, and pC is picocoulombs, N is newtons, and d is the piezoelectric constant.

EXAMPLE 7

A solution of polyvinylidene fluoride (Solef ® 1012, 70 percent by weight) and polymethylmethacrylate (Rohm & Haas Acryloid ® A-11, 30 percent by weight) in dimethyl formamide was prepared at a solids content of 20 percent by weight. This solution was coated onto 0.6 mil aluminum foil, using a 6 inch knife coater, dried at 275° F. for 15 minutes, heated to 425° F. for 10 minutes, and subsequently cooled rapidly. Sections of the resulting film, about 0.9 mil in thickness, were poled as described in U.S. Pat. Nos. 4,067,056; 4,079,437; or 4,089,034. The pyroelectric output, volts per °C., of the sections was evaluated, as were the wide angle X-ray scattering curves in the region of 2$\theta$ from 14° to 24°. The films exhibited crystalline scattering peaks at 2$\theta$=21°. This peak is characteristic of the beta-crystalline morphology. The integrated crystalline intensities of these peaks in arbitrary, but self-consistent units correlate with the pyroelectric output as shown in the table below:

| Sample | I$_c$ | Pyroelectric output (V/°C.) |
| --- | --- | --- |
| 1 | 3.90 | 4.30 |
| 2 | 3.86 | 4.28 |
| 3 | 1.98 | 1.63 |
| 4 | 1.34 | .11 |

EXAMPLE 8

A blend of 70 percent by weight polyvinylidene fluoride (experimental Pennwalt resin—Kynar ® 960) and 30 percent by weight poly methylmethacrylate/methylmethacrylate-ethyl methacrylate copolymer (Dupont Lucite ® 147K) was obtained by melt blending in an extruder. A 4 mil thick film was obtained from the extrudate by reheating to 220° C. and forming in a press. This film was removed from the press and rapidly cooled by dipping into ice water to prevent crystallization. The film was then poled as described in U.S. Pat. Nos. 4,067,056; 4,079,437; or 4,089,034. The poled film exhibited a pyroelectric response of 0.8 V/mil-°C.

EXAMPLE 9

Thirty-four grams of dimethylformamide were added to 6.0 grams polyvinylidene fluoride (Pennwalt Kynar ® 301F), and the mixture was agitated for 2 hours at ambient temperature to dissolve the resin. Ten grams of 40 percent by weight polymethylmethacrylate in methylethylketone (Rohm and Haas Acryloid ® A-101) were then added and the mixture was agitated for an hour at ambient temperature to yield a 60 to 40 weight ratio of PVF$_2$ to PMMA at a combined concentration of 20 percent by weight in the total solution.

A film was cast from a portion of the resulting milky solution onto 0.7 mil thick aluminum foil using an 18 inch knife coater. The coated foil was immediately placed on a 150° C. hot plate for 10 minutes to drive off most of the DMF, then placed in a 150° C. oven for 20 minutes and then rapidly cooled to room temperature.

Gold was sputtered onto the resulting approximately one mil thick coating to form an electrode for poling. The coated foil was heated in an oven to 105° C. over a 12 minute interval with 1,250 volts applied between the gold electrode and the aluminum foil substrate. The coated foil was held at this temperature and voltage conditions for 60 minutes and then cooled to below 50° C. over a 15 minute period while the voltage was maintained. The measured pyroelectric output was 2.6 volts per °C.

EXAMPLE 10

Polyvinylidene fluoride (Pennwalt Kynar® 301F) and polymethymethacrylate (Rohm and Haas Acryloid® A-11) were combined in 60 to 40 ratio by weight, respectively, and mixed with sufficient dimethylformamide to provide a concentration of 6.67 percent by weight of the combined resins in solution.

The resulting solution was filtered and then distributed from a hypodermic syringe over the surface of a silicon IC (integrated circuit) slice. The IC slice was then placed in a container, and the container was heated by infrared lamps and purged with nitrogen to drive off most of the DMF solvent.

The coated IC slice was transferred to a 150°–200° C. oven for 40 minutes and was then rapidly cooled to room temperature.

Gold was sputtered onto the resultant approximately 0.6 mil average thickness coating to form an electrode for poling. The coated IC slice was then heated in an oven to 120° C. over a 10 minute period while a potential of 600 to 750 volts was applied between the gold electrode and the silicon substrate. The coated IC slice was held at these temperature and voltage conditions for 30 minutes and was then cooled to below 86° C. over a 10 minute period while the voltage was maintained. The measured pyroelectric output equaled 1.1 volts per °C. or about 1.9 volts per mil°C.

We claim:

1. A method for forming a pyrolectric and isotropic piezoelectric polymeric film comprising:
    (a) forming a coating solution of a polymer blend in a suitable solvent, said polymer blend comprising polyvinylidene fluoride and at least one polymer which is miscible with said polyvinylidene fluoride at a temperature above the melting point thereof;
    (b) solvent casting said solution to form a thin polymeric film;
    (c) removing the solvent from said film and heating same to a sufficient temperature and for a sufficient time to render said film substantially amorphous;
    (d) cooling said film at a rate and to a temperature sufficient to prevent crystallization of said film, and
    (e) polarizing said film to render same pyroelectric and isotropically piezoelectric.

2. The process of claim 1 wherein said polyvinylidene fluoride comprises at least about 50 percent by weight of said blend.

3. The process of claim 1 wherein said polymer is selected from the group consisting of acrylates, methacrylates, and polyvinylacetate.

4. A process for forming a pyroelectric and isotropic piezoelectric polymeric coating on at least a portion of a device comprising:
    (a) forming a coating solution of a polymer blend in a suitable solvent, said polymer blend comprising polyvinylidene fluoride and at least one polymer which is miscible with said polyvinylidene fluoride at a temperature above the melting point thereof;
    (b) solvent casting said solution on said device to form a thin polymeric coating on at least a portion thereof;
    (c) removing the solvent from said coating and heating same to a sufficient temperature and for a sufficient time to render said coating substantially amorphous;
    (d) cooling said coating at a rate and to a temperature sufficient to prevent crystallization of said coating; and
    (e) polarizing said coating to render same pyroelectric and isotropically piezoelectric.

5. The process of claim 4 wherein said polyvinylidene fluoride comprises at least about 50 percent by weight of said blend.

6. The process of claim 4 wherein said polymer is selected from the group consisting of acrylates, methacrylates, and polyvinylacetate.

* * * * *